United States Patent [19]

Kane

[11] Patent Number: 5,030,921

[45] Date of Patent: Jul. 9, 1991

[54] CASCADED COLD CATHODE FIELD EMISSION DEVICES

[75] Inventor: Robert C. Kane, Woodstock, Ill.

[73] Assignee: Motorola, Inc., Schaumburg, Ill.

[21] Appl. No.: 478,288

[22] Filed: Feb. 9, 1990

[51] Int. Cl.[5] .......... H03F 3/42

[52] U.S. Cl. .......... 330/70; 313/309; 313/336; 313/351; 330/207 R

[58] Field of Search .......... 313/308, 309, 336, 351; 330/157, 207 R, 70, 71

[56] References Cited

U.S. PATENT DOCUMENTS

| | | | |
|---|---|---|---|
| 3,581,148 | 5/1971 | Brignet | 313/309 X |
| 3,755,704 | 8/1973 | Spindt et al. | 313/309 |
| 3,789,471 | 2/1974 | Spindt et al. | 29/25.17 |
| 3,812,559 | 5/1974 | Spindt et al. | 29/25.18 |
| 3,894,332 | 7/1975 | Nathanson et al. | 29/578 |
| 3,921,022 | 11/1975 | Levine | 313/309 |
| 3,998,678 | 12/1976 | Fukase et al. | 156/3 |
| 4,008,412 | 2/1977 | Yuito et al. | 313/309 |
| 4,178,531 | 12/1979 | Alig | 313/409 |
| 4,307,507 | 12/1981 | Gray et al. | 29/580 |
| 4,513,308 | 4/1985 | Greene et al. | 357/55 |
| 4,578,614 | 3/1986 | Gray et al. | 313/309 |
| 4,685,996 | 8/1987 | Busta et al. | 156/628 |
| 4,721,885 | 1/1988 | Brodie | 31/576 |
| 4,827,177 | 5/1989 | Lee et al. | 31/306 |
| 4,874,981 | 10/1989 | Spindt | 313/309 |
| 4,970,887 | 7/1976 | Smith et al. | 313/309 |

FOREIGN PATENT DOCUMENTS

| | | |
|---|---|---|
| 0172089 | 7/1985 | European Pat. Off. . |
| 2604823 | 10/1986 | France . |
| 855782 | 8/1981 | U.S.S.R. . |
| 2204991 A | 11/1988 | United Kingdom . |

OTHER PUBLICATIONS

A. Vacuum Field Effect Transistor Using Silicon Field Emitter Arrays, by Gray, 1986 IEDM.

Advanced Technology: flat cold-cathode CRTs, by Ivor Brodie, Information Display 1/89.

Field-Emitter Arrays Applied to Vacuum Flourescent Display, by Spindt et al., Jan. 1989 issue by IEEE Transactions on Electronic Devices.

Field Emission Cathode Array Development for High--Current Density Applications by Spindt et al., dated Aug. 1982, vol. 16 of Applications of Surface Science.

*Primary Examiner*—James B. Mullins

*Attorney, Agent, or Firm*—Steven G. Parmelee

[57] ABSTRACT

Field emission devices are cascaded in multiple stages, such that certain structures function as electrodes for field emission devices of differing stages.

10 Claims, 1 Drawing Sheet

CASCADED COLD CATHODE FIELD EMISSION DEVICES

TECHNICAL FIELD

This invention relates generally to cold cathode field emission devices.

BACKGROUND OF THE INVENTION

Solid state cold cathode field emission devices (FEDS) are known. Such devices typically have at least two, and generally three, electrodes (in the former, an anode and a cathode, and in the latter, an anode, cathode, and gate). In some prior art embodiments, these elements are configured in a non-planar orientation (for example, see Spindt, et al., U.S. Pat. No. 3,812,559). In another prior art embodiment, these elements are configured in a generally planar configuration with respect to one another (for example, see Lee et al., U.S. Pat. No. 4,827,177).

The prior art also teaches that such cold cathode field emission devices can be configured in an array with one another, for example, to support anticipated current carrying capacity requirements. In such arrays, the various electrodes of the device are configured in parallel with one another; for example, all of the cathode electrodes are electrically parallel to one another, and all of the anode electrodes are in parallel with one another.

To date, if one wished to construct a multistage device, such as an amplifier, using such devices, the various discrete FEDs of the multistage device would simply be appropriately coupled between one another to form and intercouple the desired stages.

Accordingly, a need exists for a better configuration for a multistage device that makes use of FEDs. Preferably, the various stages making up the device can be formed together in a single integrated structure.

SUMMARY OF THE INVENTION

These needs and others are substantially met through provision of the cascaded FEDs disclosed herein. Pursuant to this invention, FEDs that make up the various stages of the resultant device share common structure to support differing electrode purposes.

In one embodiment of this invention, the structure that functions as an anode for a first FED also functions as the emitter for a second FED.

In another embodiment of this invention, the structure that functions as an anode for a first FED also functions as a gate for a second FED.

In yet another embodiment of this invention, the parallel structures that function as anodes for a plurality of parallel configured FEDs also serves as either the emitters or gates (as appropriate to the particular application) of a second plurality of parallel configured FEDs.

BEST MODE FOR CARRYING OUT THE INVENTION

Figure 1:
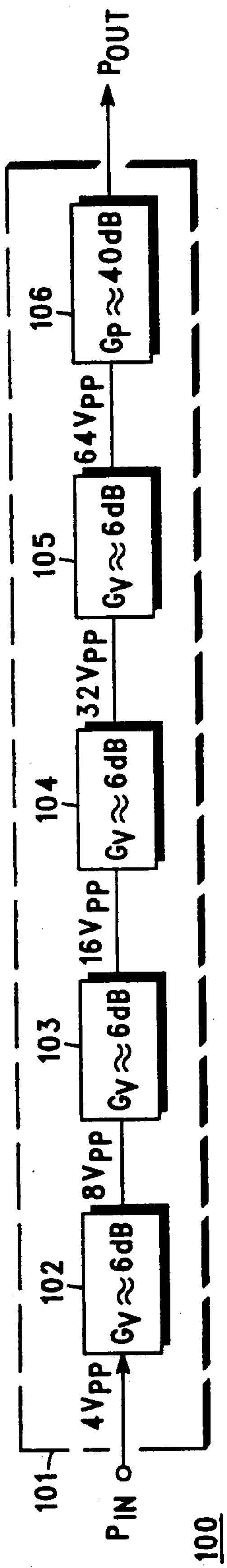
FIG. 1 comprises a block diagram depiction of a multistage device that can usefully incorporate this invention.

In FIG. 1, a multistage device can be seen as generally depicted by the reference number 100. In this embodiment, the device (100) has been fully integrated within a single monolithic structure (101). This particular device (100) has five gain stages (102–106). Each of the first four stages (102–105) provides a 6 dB voltage gain. The final stage (106) provides a 40 dB power gain. Pursuant to this invention, as explained below in more detail, these stages can be comprised of FEDs that are cascaded with one another and that share common structure in support of various electrode functions.

Figure 2:
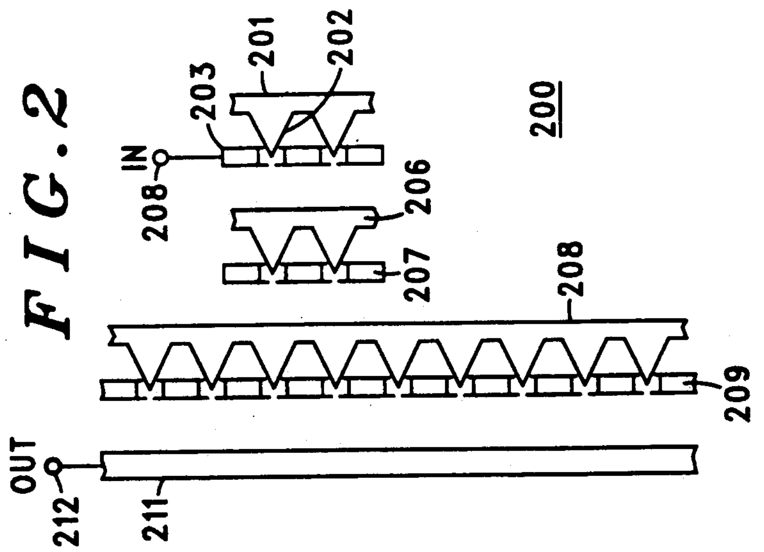
FIG. 2 comprises a top plan view of a first embodiment as configured in accordance with the invention.

In FIG. 2, a first embodiment of the invention can be seen as depicted generally by the reference numeral 200. In this embodiment, the device (200) includes a first stage amplifier comprised of a plurality of parallel configured FEDs, including a plurality of emitters (202), a plurality of gates (203), and an anode structure (206). In this embodiment, the input (208) couples to the gate structure (203). So configured, and properly biased, cold cathode field emission will be induced at the tips of the emitter structures (202), which field emission will be modulated as desired by the gate structure (203), and with resultant emitted electrons collected at the anode (206). (Information regarding the structure of such a planar configured cold cathode field emission device is understood in the art. For example, details regarding the construction and operation of such a device can be found in U.S. Pat. No. 4,827,177 and in pending application Ser. No. 330,050, both of which are incorporated herein by this reference.)

The device (200) includes a second stage comprised of a second plurality of parallel coupled emitters (206), a similar gate structure (207), and another anode (208). As depicted in this embodiment, however, the emitter structure (206) of this second stage also functions as the anode structure for the first stage, as already described above.

In a similar manner, this second stage drives and is integrally coupled to a third stage which includes a third plurality of emitters (208), a gate structure (209), and a final anode structure (211) that couples to an output (212).

In this particular embodiment, the first two stages would typically provide a voltage amplification function, whereas the third stage would represent a power stage that would boost both voltage and current as apparent at the final output.

Figure 3:
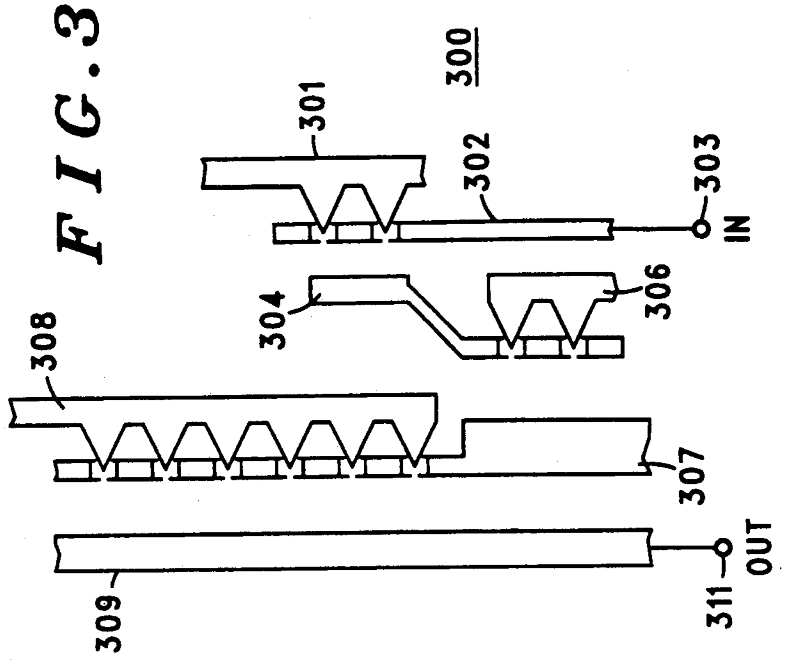
FIG. 3 comprises a top plan view of a second embodiment as configured in accordance with the invention.

Referring now to FIG. 3, a second embodiment of a multistage device can be seen as depicted generally by the reference numeral 300. A three stage device is again depicted, wherein the first stage includes a plurality of emitters (301), a gate structure (302) that couples to an input (303), and an anode (304). In this embodiment, however, the anode structure (304) for the first stage comprises the gate structure (304) for the second stage, which also includes a plurality of emitters (306) and an anode (307). In a similar manner, the gate structure (307) for the third and final stage also consititues the anode for the second stage, wherein the third stage also includes a plurality of emitters (308) and an anode structure (309) that couples to a final output (311).

It would of course be possible to vary the number of stages in either embodiment to conform to anticipated applications and requirements. Also, if desired, these cascaded FED based stages could be configured in a non-planar orientation

What is claimed is:

1. An electronic device having a plurality of cold-cathode field emission devices, wherein the device includes:

(A) a first field emission device having a plurality of electrodes; and (B) a second field emission device having a plurality of electrodes, wherein at least one of the electrodes for the first field emission device comprises one of the electrodes for the second field emission device.

2. The electronic device of claim 1 wherein the plurality of electrodes of the first field emission device are disposed substantially co-planar to one another.

3. The electronic device of claim 1 wherein the first field emission device has a first gain associated therewith.

4. The electronic device of claim 3 wherein the second field emission device has a second gain associated therewith.

5. The electronic device of claim 4 wherein the electronic device has a total gain associated therewith, which total gain is a function, at least in part, of the first gain and the second gain.

6. The electronic device of claim 1 wherein the plurality of electrodes for the first field emission device and the plurality of electrodes for the second field emission device are substantially co-planar with respect to one another.

7. The electronic device of claim 1 wherein the device further includes a third field emission device having a plurality of electrodes, wherein at least one of the electrodes for the second field emission device comprises one of the electrodes for the third field emission device.

8. An electronic device having a plurality of cold-cathode field emission devices, wherein the device includes:

(A) a first field emission device having at least an emitter electrode; and (B) a second field emission device having at least an emitter electrode and a gate electrode, wherein one of the emitter and gate electrodes for the second field emission device comprises an anode electrode for the first field emission device.

9. An electronic device having at least a first array of cold-cathode field emission devices and a second array of cold-cathode field emission devices, wherein the cold-cathode field emission devices of the first array each have at least an emitter electrode, and wherein the cold-cathode field emission devices of the second array each have at least an emitter electrode and a gate electrode, wherein one of the emitter and gate electrodes for at least some of the cold-cathode field emission devices for the second array comprise an anode electrode for at least some of the cold-cathode field emission devices for the first array.

10. An amplifier having a plurality of gain stages, wherein:

(A) a first gain stage comprises a first field emission device having a plurality of electrodes; and (B) a second gain stage comprises a second field emission device having a plurality of electrodes, wherein at least one of the electrodes for the first field emission device comprises one of the electrodes for the second field emission device.

* * * * *